United States Patent [19]

Crager et al.

[11] Patent Number: 4,894,586
[45] Date of Patent: Jan. 16, 1990

[54] CROSSED-FIELD AMPLIFIER BIAS CIRCUIT AND METHOD FOR IMPROVED STARTING

[75] Inventors: Carl R. Crager; Kenneth F. Ramacher, both of Montoursville; Frank A. Zawada, Williamsport, all of Pa.

[73] Assignee: Litton Systems, Inc., Beverly Hills, Calif.

[21] Appl. No.: 157,644

[22] Filed: Feb. 18, 1988

[51] Int. Cl.⁴ .......................... H01J 25/34; H03F 3/54
[52] U.S. Cl. ..................... 315/39.51; 315/94; 330/44; 330/47
[58] Field of Search ............ 315/39.3, 39.71, 3.5, 315/3.6, 5.35, 5.12, DIG. 5, 37, 46, 48, 94, 101; 313/399, 103 R, 387, 446; 330/42, 1, 44, 45, 47

[56] References Cited

U.S. PATENT DOCUMENTS

| | | | |
|---|---|---|---|
| 2,275,581 | 3/1942 | Barton | 315/94 |
| 2,913,629 | 11/1959 | White | 315/94 |
| 3,255,422 | 6/1966 | Feinstein et al. | 330/44 X |
| 3,448,330 | 6/1969 | Farney | 315/39.3 |
| 3,503,001 | 3/1970 | Farney | 330/42 |
| 3,577,172 | 5/1971 | Dench | 330/43 X |
| 3,593,057 | 7/1971 | Berstein | 315/39.3 X |
| 3,609,581 | 9/1971 | McDowell | 315/39.3 X |
| 3,619,709 | 11/1971 | Dudley | 330/42 X |
| 4,082,979 | 4/1978 | Farney et al. | 330/43 X |
| 4,675,573 | 6/1987 | Miram et al. | 315/94 |
| 4,677,342 | 6/1987 | MacMaster et al. | 315/39.3 |
| 4,700,109 | 10/1987 | MacPhail | 315/39.3 |

Primary Examiner—Eugene R. LaRoche
Assistant Examiner—Seung Ham
Attorney, Agent, or Firm—Poms, Smith, Lande & Rose

[57] ABSTRACT

The present invention discloses a cross-field amplifier having an anode and cathode with a pair of permanent magnets which create a magnetic field perpendicular to an electric field created between the anode and cathode. An electric bias circuit is connected between the cathode and a power supply that normally supplies energy to an oxygen source within the amplifier. This bias circuit supplies a negative DC voltage to the cathode. After the amplifier is turned off, the DC bias holds electrons within the interaction area between the cathode and anode for supplying the electrons needed to quickly restart the amplifier.

10 Claims, 4 Drawing Sheets

CROSSED-FIELD AMPLIFIER BIAS CIRCUIT AND METHOD FOR IMPROVED STARTING

This invention has been developed under contract with the United States Government, Department of the Navy, Contract No. FC0103/F04606-84-G-0011 who has a license to practice the invention.

BACKGROUND OF THE INVENTION

1. Field of the Invention

The present invention relates to a crossed-field amplifier and, more particularly, to a bias circuit and method used within a crossed-field amplifier to reduce amplifier jitter caused by stopping and restarting the amplifier.

2. Description of the Prior Art

Crossed-field amplifiers have been known for several years. These amplifiers are typically utilized in electronic systems which require high voltages, such as radar systems. Typically the cathode of a crossed-field amplifier is operated at a high negative voltage. Such high voltages generate heat which may be reduced by a liquid cooling system. An example of a crossed-field amplifier which is liquid cooled is shown in U.S. Pat. No. 4,700,109, issued Oct. 13, 1987, by G. R. MacPhail, which is assigned to the common assignee.

In some applications, it is desirable to switch crossed-field amplifier on and off so as to reduce the amount of electro-magnetic energy radiated from an electronic system within which the crossed-field amplifier is used. This feature is desirable if, for example the amplifier were utilized within a radar system on board a ship where excessive radiation of electromagnetic energy could be utilized to identify the ship's location.

A crossed-field amplifier, however, has difficulty restarting after it has been turned off. That is, at lower pulse repetition frequencies the amplifier will not start quickly enough to pass the stringent specifications set for it or the system in which it is used.

SUMMARY OF THE INVENTION

Accordingly, an object of the present invention is to establish a method and device for improving the starting capabilities of a crossed-field amplifier.

Another object of the present invention is to create a device which will improve the starting characteristics of a crossed-field amplifier that may be retrofitted into the amplifier so that the electronic system within which the amplifier is to be utilized need not be modified.

In accomplishing these and other objects, there is provided a bias circuit connected between a power supply which supplies power to the crossed-field amplifier and the amplifier's cathode.

This circuit holds the electrons in the interaction area between the cathode and anode of the crossed-field amplifier when the amplifier is turned off. The presence of the electrons helps to restart the amplifier when it is turned on.

The inventive concept described herein was disclosed to the technical personnel at the Department of the Navy responsible for the contract mentioned above. These personnel did not believe that the concept would work and required a theoretical evaluation of the circuit and its function within a crossed-field amplifier. This evaluation further proved that the bias circuit of the present invention improved the starting characteristics of a crossed-field amplifier.

BRIEF DESCRIPTION OF THE DRAWINGS

Other objects and advantages of the present invention will become apparent after reference to the following detailed description and accompanying drawings, wherein.

BRIEF DESCRIPTION OF THE PREFERRED EMBODIMENT

Figures 1, 6:
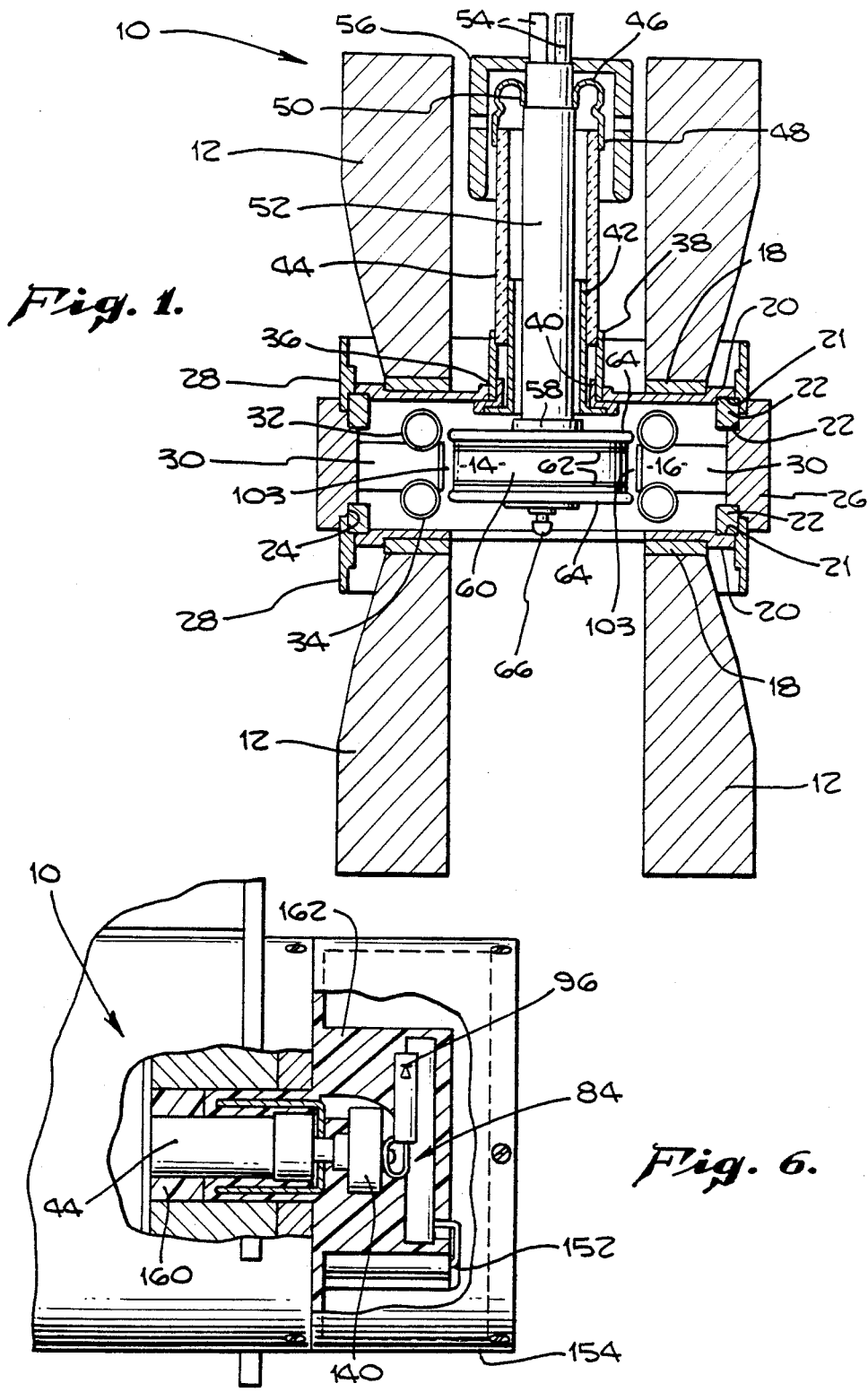
FIG. 1 is a cross-sectional view showing a typical crossed-field amplifier in which the present invention may be utilized.
FIG. 6 is a partially cross-sectioned view taken along line 6—6 of FIG. 5.

Referring now to the drawings, FIG. 1 shows a crossed-field amplifier 10 formed between a pair of hollow, cylindrically shaped permanent magnets 12. The pair of magnets form upper and lower magnets between which is mounted a cathode 14 and anode 16 of the crossed-filed amplifier 10. The inner ends of upper and lower magnets 12 are provided with angular pole pieces 18 which, in turn, abut against a pair of annular covers 20 whose outer periphery is grooved at 21 to receive a pair of closure rings 22. The closure rings 22 fit into grooves 24 in the inner diameter of a body ring 26 which forms part of the anode 16. The covers 20, closure rings 22 and body ring 26 are locked together by two weld flanges 28.

Extending radically from the inner surface of body ring 26 is a plurality of vanes 30 which are attached thereto, as by brazing. The vanes are electrically connected by a pair of toroidally shaped helical spring coils 32 and 34 which have right-hand and left-hand windings, respectively. The coils 32 and 34, vanes 30 and ring 26 are all electrically connected to form the anode 16.

The upper, annularly shaped cover 20 includes a flanged aperture 36, which receives a first tube 38, a shouldered ring 40 and a flanged tube 42 stacked concentrically therein. A high voltage insulating ceramic tube 44 is received between the outer tube 38 and the flanged tube 42 and retained therebetween. The insulator tube 44 extends up through the central bore of upper magnet 12. The upper end of ceramic tube 44 receives a annular clip 46 which, when cross-sectioned, forms a U-shape. The longer leg 48 of the U-shaped clip 46 fits over the outer diameter of the ceramic tube 44 while the shorter leg 50 thereof fits singly about a standpipe 52 that surrounds a pair of cathode coolant pipes 54. The arrangement for cooling the cathode through coolant pipes 54 is similar to that shown in U.S. Pat. No. 4,700,109 identified above. Surrounding the standpipe 52 and coolant pipe 54 is a coolant lead support 56.

At the lower end of coolant standpipe 54, a flange 58 mounts the cathode 16 which consists of a cylindrically shaped cathode emitter surface 60, that may be made of beryllium, spacers 62 on each side thereof, that may be made of beryllium or copper, and end shields 64 on each side of the spacers. The upper end shield 54 mounts to flange 58, while the lower end shield 64 mounts to the cathode terminal 66. The cathode terminal 66 is provided with a high negative voltage, such as 13 KV, through the central bore in lower magnet 12.

The crossed-field amplifier described in FIG. 1 has been built and tested. The amplifier developed a technical problem in that it would not start at low pulse repetition frequencies. The non-start condition represented a marginal situation in that some amplifiers exhibited the problem while others, supposedly identical, did not. As a result, the production yield of the crossed-field amplifier 10 described generally in FIG. 1 was disappointingly low.

Figure 2:
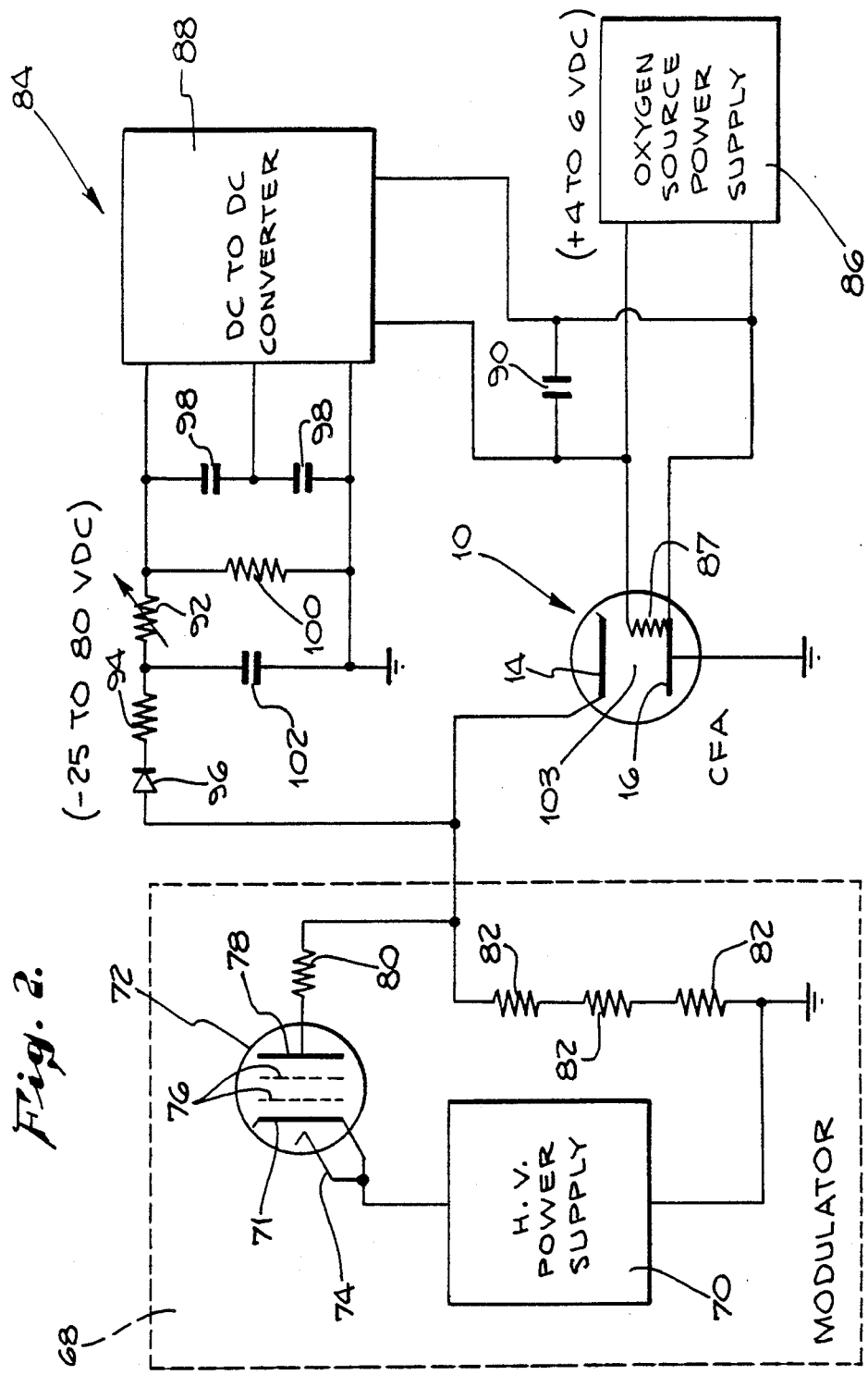
FIG. 2 is a schematic diagram showing a crossed-field amplifier and the bias circuit of the present invention.

Referring now to FIG. 2, the crossed-field amplifier 10 is shown schematically as it is connected for use in a typical electrical system. The crossed-field amplifier 10 is provided with high voltage power from a modulator 68 which includes a high voltage power supply 70 whose positive terminal connects to ground and whose negative terminal connects to a cathode 71 of a switch tube 72 having a filament 74 also connected to the negative terminal. Electrons which boil off of the cathode 71 pass through a pair of control grids 76 to an anode 78. The anode 78 connects through a resistor 80 and a series of feedback resistors 82 to ground and also connects through resistor 80 to the cathode 14 of the crossed-field amplifier 10.

The present invention came about through a modification to the electrical connection of the crossed-field amplifier which placed a negative 70 VDC, plus or minus 10 VDC, bias voltage on the ground side of the feedback resistors 82 between the switch tube 72 and the crossed-field amplifier 10. With this bias voltage, it was found that 95% of the crossed-field amplifiers 10 would meet the jitter requirement. That is, the amplifiers 10 would start within 20 nanoseconds at a 50 Hz pulse rate frequency. In addition, approximately 50% of the tubes tested would meet a 20 nanoseconds start time at a 10 Hz pulse rate frequency.

Because the bias voltage is unattractive from a system point of view, the bias circuit, shown at 84 in FIG. 2, of the present invention was designed to be powered from a power supply closely associated with the crossed-field amplifier, that is, an oxygen source power supply 86.

As is known in the art, crossed-field amplifiers 10 which utilize a beryllium cathode 14 actually utilize beryllium oxide as the source of electrons since beryllium quickly oxidizes and is generally not found as a pure element in nature. The secondary omission of electrons from the beryllium oxide of the cathode surface quickly strips away the available oxygen thus resulting in a decreased emission. To solve this problem, a source of oxygen is provided in close proximity to the cathode. This source of oxygen may be cupric oxide which, when heated, turns to cuprous oxide and releases oxygen. The oxygen quickly reacts with the beryllium to replenish the depleted beryllium oxide upon the cathode surface. Thus, the crossed-field amplifier 10 was equipped with a heating element 87 for heating the cupric oxide. The output of the oxygen source power supply 86 varies between +4 to +6 VDC. In order to generate the −60 to −80 VDC necessary to provide the biased voltage previously discovered to reduce the crossed-field amplifier jitter, a DC to DC converter 88 is attached to the oxygen source power supply 86. The power supply 86 is connected with a positive terminal connected to the anode 16 of the crossed-field amplifier 10 and a negative terminal connected to the resistor that formed heater 87 which is then connected to the anode 16 and to ground. Connected between the positive and negative input terminals of the converter 88 is a filter capacitor 90.

The negative output terminal of the DC converter is connected to an adjustable resistor 92, to a second resistor 94, and then to the cathode of a high voltage diode assembly 96, whose anode is connected to the cathode 14 of amplifier 10. The negative output terminal of the DC to DC converter 88 is also connected through a pair of serially connected filter capacitors 98 which have the common electrode therebetween connected to the converter 88 and the output electrode of the two serially connected capacitors connected to the positive terminal of converter 88 and to ground. Connected between the negative output terminal of converter 88 and adjustable resistor 92 is a resistor 100 which is then connected to ground, while a capacitor 102 connects the junction between resistors 92 and 94 to ground. The resistor 100 and capacitor 102 form an RC filter around adjustable resistor 92.

The bias circuit 84 which includes the converter 88, resistors 92 and 94, filters 98, 100 and 102 and isolating diode 96 improved the starting capability of the crossed-field amplifier 10 to a point where all newly manufactured crossed-field amplifiers 10 met specifications. Further, the earlier manufactured amplifiers, when modified by adding the bias circuit 84 also met specifications. Finally, the bias circuit 84 worked so well that the starting specifications could be changed from 20 nanoseconds peak at 50 Hz pulse rate frequency to 20 nanoseconds peak at 10 Hz pulse rate frequency.

The improvement created by the bias circuit 84 was not believed by some skeptics. These skeptics required the creation of a theoretical study to establish why the biased circuit brought about the improvements. It was found through theoretical analysis that the crossed-field amplifier 10, once turned off, required the existence of electrons within the interaction area 103 between the cathode 14 and anode 16. The presence of a bias circuit 84 generates enough potential across the interaction area 103 to hold some electrons in this area after the amplifier 10 is turned off. Theoretically it was determined that the number of electrons required is in the order of 10's. Once the skeptics were convinced, the bias circuit 84 described thus far was approved for installation in all crossed-field amplifiers 10 resulting in an improved and more stringent specification therefore, as discussed above.

Figure 3:
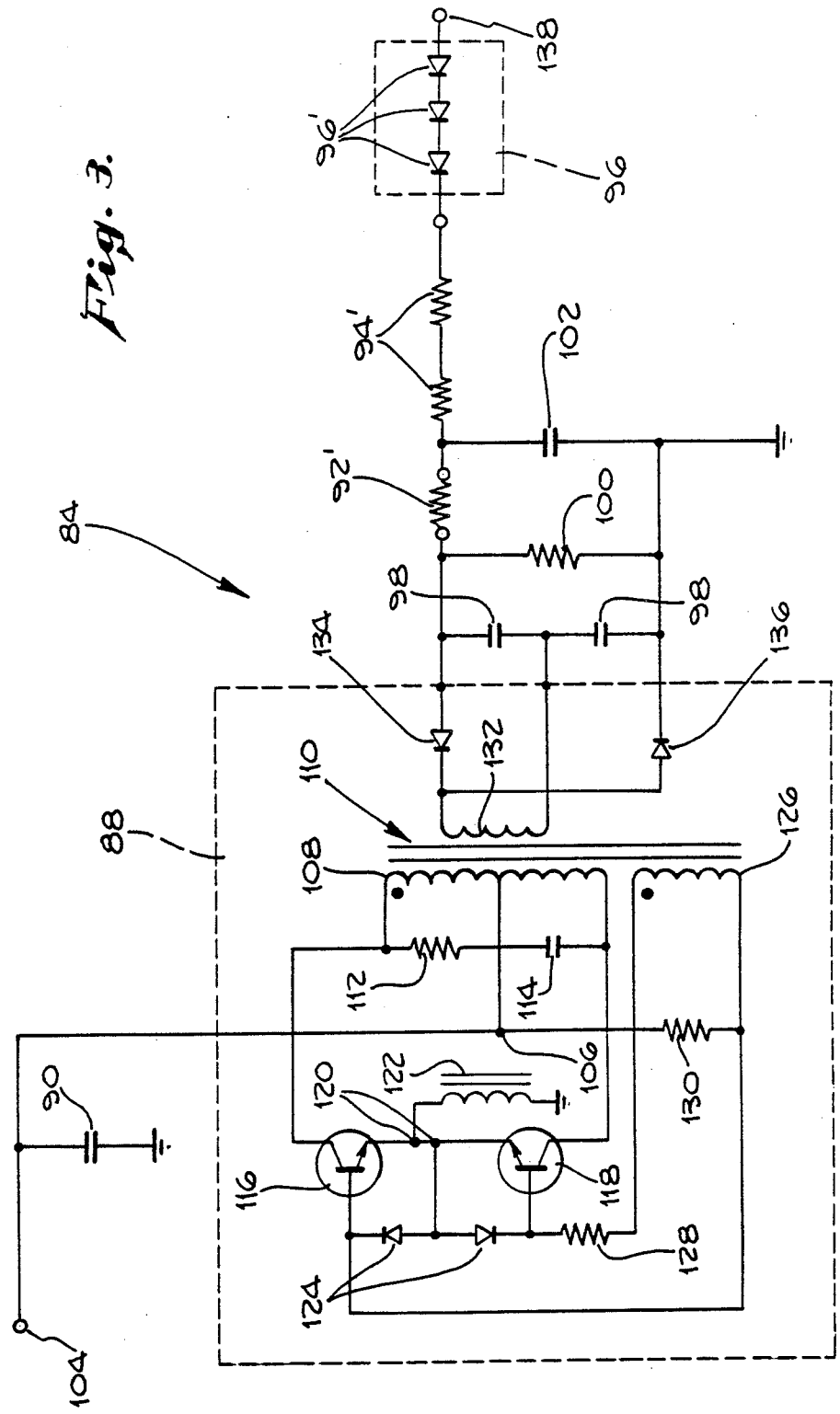
FIG. 3 is a schematic diagram showing the bias circuit of FIG. 2 in greater detail.

Referring now to FIG. 3, the bias circuit 84 is shown in greater detail wherein a negative output terminal 104 of the oxygen source power supply 86 connects to the input electrode of capacitor 90 whose output electrode connects to ground. The negative terminal 104 then connects to the DC to DC converter 88 and to a junction 106, which connects to a central terminal of a winding 108 of a voltage step-up transformer 110. The first end of winding 108 is joined to its opposite end by a serially connected resistor 112 and a capacitor 114. Each end of winding 108 is also connected to the collector terminal of an NPN transistor 116 and 118. The emitters of transistors 116 and 118 are joined together at junction 120 which connects to one terminal of a coil 122 whose second terminal connects to ground. Junction 120 also connects to a junction between the anodes of a pair of chopper diodes 124 whose cathodes each connect to one of the bases of the transistors 116 and 118. The base of transistor 116 is connected to a first terminal of a second transformer winding 126 on transformer 110, while the second terminal of winding 126 connects via a resistor 128 to the base of transistor 118. Junction 106 is then connected via a resistor 130 to the first terminal of winding 126 to complete the input side of the DC to DC converter 88.

It will now be seen that the transformer 110, transistors 116 and 118, and coil 122 form an oscillating circuit, the maximum amplitude of which is chopped by diodes 124. The voltage increase across transformer 110 is applied to an output winding 132 of transformer 110 having a first terminal of the winding 132 connected to the cathode of a rectifying diode 134. The same first terminal of winding 132 is also connected to the anode of a second rectifying diode 136. The second terminal of winding 132 connects to the junction between filter capacitors 98. The anode of diode 134 connects to the first terminal of the serially connected capacitors 98, while the cathode of diode 136 connects to the opposite terminal of the pair. That cathode of diode 136 is also connected to ground.

It will be seen in FIG. 3 that the second resistor 94 actually comprises a pair of serially connected resistors 94', while the high voltage diode assembly 96 comprises three serially connected power diodes 96' connected to a terminal 138 that, in turn, is connected to the cathode 14.

The adjustable resistor 92 is shown as a fixed resistor 92' in FIG. 3. When the circuit was first designed, the adjustable resistor 92 was utilized to adjust for the variation of the out-put voltage of the oxygen source power supply 86. However, it has also been found that each amplifier 10 may be optimized for its best starting characteristics by adjusting the bias voltage to the cathode 14. This bias voltage may vary between −25 VDC to −80 VDC depending upon the amplifier 10; however, −50 VDC is generally the bias voltage selected. The bias voltage applied to the cathode varies depending upon the output voltage of the oxygen source power supply 86 which may vary between +4 to +6 VDC. Using this source voltage through the bias circuit 84 and the DC to DC converter 88, it has been found that the optimum voltage applied to the cathode 14 may be selected by adjusting the resistance of resistor 92. Accordingly, a resistance is selected and then a fixed resistor 92' is placed within bias circuit 84 which may have any of a plurality of resistances from 2K ohms to 56 K ohms.

Figure 4:
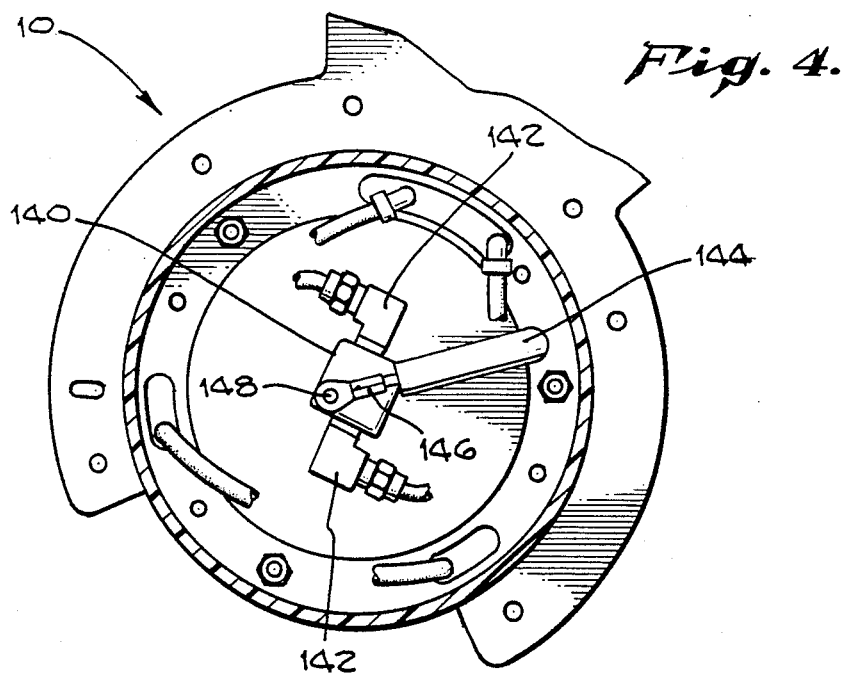
FIG. 4 is top plan view of a crossed-field amplifier equipped with liquid cooling which is modified to receive the bias circuit of the present invention.

Referring now to FIG. 4, a top view of the crossed-field amplifier 10 is shown where the coolant pipes 54 (FIG. 1) pass into a header 140 which is connected by suitable plumbing 142 to a source of coolant (not shown). Attached to the header is an insulated wire 144, insulated to 40 KV, for example, which is passed through the bore of the upper magnet 12 and connected to the cathode 14. In the preferred embodiment, the header 140 is conductive and the wire connected to cathode 14 is provided with a terminal 146 which has been crimped to the end of the wire. The terminal is attached to the header 140, as by a screw 148.

Figure 5:
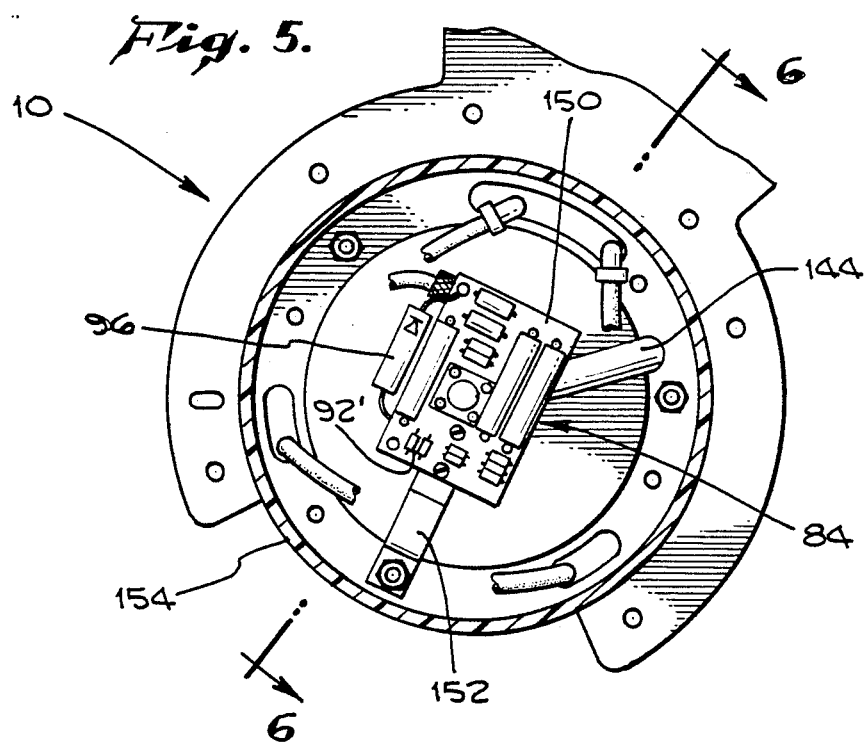
FIG. 5 is a view similar to FIG. 4 showing the bias circuit mounted upon the amplifier.

As seen in FIG. 5, a printed circuit board 150, upon which is mounted the bias circuit 84, is attached by a bracket 152 to a housing 154 of amplifier 10. The high voltage isolating diode 96 is then connected between the printed circuit board 150 and the header 140 to complete the interconnection between the bias circuit 84 and the cathode 14.

Once the printed circuit board 150 which mounts the bias circuit 84 has been permanently attached to the crossed-field amplifier 10, the adjustable resistor 92 may be utilized to test the amplifier 10 and to optimize its starting characteristics. Once the appropriate resistance has been selected, the adjustable resistor 92 is replaced with a fixed, optimized resistor 92, Referring now to FIG. 6, the final step in installing the biased circuit 84 is shown. Once the tube has been optimized and evacuated, a first ring 160 of room temperature vulcanizing material is placed within the bore of upper magnet 12 between the inner diameter of the bore and the outer diameter of the ceramic insulator 44. Thereafter, a suitable mold (not shown) is placed over the plumbing 142 (not shown in FIG. 6) and the bias circuit 84. The area around the header 140 is then filled with a suitable room temperature vulcanizing material 162 to encapsulate the bias circuit 84 thus completing the installation of the circuit. The material 162 is used to isolate circuit 84 both electrically and mechanically.

While the preferred embodiment of the bias circuit 84 for a crossed-field amplifier 10 has been described, it will be understood that other variations including the voltage levels of the tube 10 and oxygen source power supply 86 may be utilized. Further, there are other sources capable of providing the necessary power to the bias circuit 84. The oxygen source power supply 86 was selected because it was a source available within the crossed-field amplifier 10. The utilization of this source permitted the modification of the tube to meet improved starting specifications without requiring modification of systems within which the amplifier 10 was utilized. Accordingly, the present invention should be limited only by the following claims.

We claim:

1. In a crossed-field amplifier having an anode and a cathode creating an electric field across a magnetic field in an interaction area, the improvement comprising:
   electric bias circuit means connected to said cathode for generating a potential from said cathode across said interaction area for causing the presence of electrons in said interaction area after said amplifier is turned off to provide for a fast start of said amplifier.

2. In a crossed-field amplifier, as claim in claim 1, additionally comprising:
   a power supply for powering said amplifier; and
   said electric bias circuit means connected between said power supply and said cathode.

3. In a crossed-field amplifier, as claimed in claim 1, additionally comprising:
   an oxygen source power supply for powering said amplifier;
   said electric bias circuit means mechanically mounted upon said amplifier, electrically connected to said cathode, and powered by said oxygen source power supply.

4. In a crossed-field amplifier, as claimed in claim 1, additionally comprising:
   said electric bias circuit means mechanically mounted upon said amplifier; and
   insulated potting material surrounding said electric bias circuit.

5. In a crossed-field amplifier having an anode and a cathode creating an electric field across a magnetic field in an interaction area, the improvement comprising:

electric bias circuit means for holding electrons in said interaction area when said amplifier is turned off;

a power supply for powering said amplifier;

said electric bias circuit means connected between said power supply and said cathode;

said electric bias circuit means further comprising:

isolating means connected to said cathode for protecting said bias circuit means form the cathode potential;

filter means connected to said isolating means; and voltage converter means connected between said filter means and said power supply to increase the output voltage of said power supply.

6. In a crossed-field amplifier, as claimed in claim 5, wherein:

said voltage converter means include a DC to DC converter having an oscillating circuit, a chopper circuit, a transformer for increasing the voltage of the chopped DC, and a rectifier circuit.

7. In a crossed-field amplifier having an anode and a cathode creating an electric field across a magnetic field in an interaction area, the improvement comprising:

a power supply;

a bias circuit connected between said power supply and said cathode;

said bias circuit including:

isolating diode means connected to said cathode, filter means connected to said diode means, and DC to DC converter means connected between said filter means and said power supply;

said bias circuit mounted upon said crossed-field amplifier; and insulating means surrounding said bias circuit, whereby said bias circuit provides a retrofit for said crossed-field amplifier to improve the starting characteristic thereof by holding electrons in said interaction area when said amplifier is turned off.

8. In a crossed-field amplifier, as claimed in claim 7, wherein:

said DC to DC converter includes an oscillating circuit, a chopper circuit, a transformer circuit, and a rectifier circuit.

9. In a crossed-field amplifier, as claimed in claim 7 wherein said bias circuit additionally comprises:

resistance means connected between said filter means and said isolating diode means; and said resistance means being adjustable to optimize the starting characteristics of said amplifier.

10. A method for improving the starting characteristics of a crossed-field amplifier having a cathode and anode for creating an electric field across a magnetic field in an interaction area, comprising the steps of:

generating a voltage from said cathode across said interaction area in the place of said first mentioned electric field after said crossed-field amplifier is turned off; and retaining free electrons in said interaction area by said voltage after said crossed-field amplifier is turned off.

* * * * *